US006794208B2

(12) United States Patent
Nakamura et al.

(10) Patent No.: US 6,794,208 B2
(45) Date of Patent: Sep. 21, 2004

(54) MANUFACTURING METHOD FOR PRINT HEAD

(75) Inventors: Atsushi Nakamura, Kanagawa (JP); Shinji Kayaba, Tokyo (JP); Makoto Ando, Tokyo (JP); Hiroshi Tokunaga, Tokyo (JP); Shinichi Horii, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/951,941

(22) Filed: Sep. 12, 2001

(65) Prior Publication Data

US 2002/0048831 A1 Apr. 25, 2002

(30) Foreign Application Priority Data

Sep. 12, 2000 (JP) .................................... P2000-276552

(51) Int. Cl.$^{7}$ ................................................ H01L 21/00
(52) U.S. Cl. ............................................. 438/21; 347/1
(58) Field of Search ................................ 438/21; 347/1

(56) References Cited

U.S. PATENT DOCUMENTS 5,506,608 A * 4/1996 Marler et al. ................. 347/18
5,537,133 A 7/1996 Marler et al.
5,670,999 A 9/1997 Takeuchi et al.
5,772,829 A * 6/1998 Cowger ...................... 156/291
5,818,478 A 10/1998 Gibson
5,976,303 A * 11/1999 Aoki ....................... 156/308.2
6,109,719 A 8/2000 Cornell

FOREIGN PATENT DOCUMENTS

EP 0671372 9/1995

OTHER PUBLICATIONS

Tummala, R.R.; Rymaszewski, E.J.; Klopfenstein, A.G.; *Microelectronics Packaging Handbook: Semiconductor Packaging*, Chapman & Hall, 1997, p. 458.*

* cited by examiner

*Primary Examiner*—Alexander Ghyka
(74) *Attorney, Agent, or Firm*—Sonnenschein, Nath & Rosenthal LLP

(57) ABSTRACT

A manufacturing method for a print head, in which a substrate member provided with heating elements is laminated to a nozzle-formed member in which ink-ejection nozzles are formed, includes the step of laminating a correcting member having approximately the same coefficient of linear expansion as the substrate member to the nozzle-formed member. A nozzle interval $L_1$ of a nozzle-formed member which doesn't laminate a correcting member at an operating temperature $T_0$ is determined as $=L_2(1+\alpha_2\Delta T)/(1+\alpha_1\Delta T)$, wherein $L_2$ is the nozzle interval and a heater interval at the operating temperature after the print head is completed; $\alpha_1$ and is the coefficient of linear expansion of the nozzle-formed member; $\alpha_2$ is the coefficient of linear expansion of the correcting member; $T_1$ is the laminating temperature of the nozzle-formed member and the correcting member; and $\Delta T$ is the difference between the laminating temperature $T_1$ and the operating temperature $T_0$.

19 Claims, 11 Drawing Sheets

MANUFACTURING METHOD FOR PRINT HEAD

RELATED APPLICATION DATA

The present application claims priority to Japanese Application(s) No(s). P2000-276552 filed Sep. 12, 2000, which application(s) is/are incorporated herein by reference to the extent permitted by law.

BACKGROUND OF THE INVENTION

1. Field of the Invention

The present invention relates to a new manufacturing method for a print head. More specifically, the present invention relates to a technique for reducing displacements as much as possible between ink-pressurizing cells, which are individually provided with heating elements, and ink-ejection nozzles, which individually correspond to the ink-pressurizing cells.

2. Description of the Related Art

Conventionally, such print heads are known in which ink-pressurizing cells, which are individually provided with heating elements, are covered by a nozzle-formed member, in which small ink-ejection nozzles are formed. When the heating elements are rabidly heated, bubbles of ink vapor (ink bubbles) are generated, and ink drops are ejected from the ink-ejection nozzles due to pressures applied by the ink bubbles.

Such a print head normally has a construction shown in FIGS. 11 and 12. With reference to the figures, a print head a includes a substrate member d which is provided with heating elements c and which defines side surfaces and one end surface of ink-pressurizing cells b. The substrate member d is constructed by depositing the heating elements c on a surface of a semiconductor substrate e formed of silicon, etc., and laminating a barrier layer f on the semiconductor substrate e at the same side as the side at which the heating elements c are deposited. The barrier layer f defines side surfaces of the ink-pressurizing cells b; in other words, it serves a side walls of the ink-pressurizing cells b. The barrier layer f is formed of, for example, a dry film which is curable by light exposure, and is constructed by laminating the dry film over the entire surface of the semiconductor substrate e, on which the heating elements are formed, and removing unnecessary parts by a photolithography process. Accordingly the substrate member d is completed.

Then, a nozzle-formed member g is laminated on the barrier layer f of the substrate member d. The nozzle-formed member g is formed of, for example, nickel, by using the electroforming technique. The nozzle-formed member g is provided with ink-ejection nozzles h, which are aligned relative to the heating elements c deposited on the substrate member d.

Accordingly, the ink-pressurizing cells b, of which end surfaces are defined by the substrate member d and the nozzle-formed member g, and side surfaces are defined by the barrier layer f, are formed. The ink-pressurizing cells b are linked with an ink passage i, and are provided with the ink-ejection nozzles h which oppose the heating elements c. The heating elements c in the ink-pressurizing cells b are electrically connected to an external circuit via conductors (not shown) deposited on the semiconductor substrate e.

Normally, a single print heat includes hundreds of heating elements c and ink-pressurizing cells b containing the heating elements c. The heating elements c are selectively heated in accordance with a command issued by a control unit of a printer, and ink drops are ejected from the corresponding ink-ejection nozzles h.

In the print head a, the ink-pressurizing cells b are filled with ink supplied via the ink passage i from an ink tank (not shown) which is combined with the print head a. When a current pulse is applied to one of the heating elements c for a short time such as 1 to 3 μs, the heating element c is rapidly heated, and a bubble of ink vapor (ink bubble) is generated at the surface thereof. Then, as the ink bubble expands, a certain volume of ink is pushed ahead, and the same volume of ink is ejected out from the corresponding ink-ejection nozzle h as an ink drop. The ink drop, which is ejected from the ink-ejection nozzle h, adheres (lands on) to a print medium such as a piece of paper, etc.

In the above-described print head a, characteristics of ink drop ejection are affected by positional relationships between the heating elements c and in-ejection nozzles h, and between the ink-pressurizing cells b and the ink-ejection nozzles h. When displacements between the heating elements c and the ink-ejection nozzles h, and between the ink-pressurizing cells b and the ink-ejection nozzles h, are large, the ejection speed may be reduced and the ejecting direction may be changed. Furthermore, it may even be impossible to eject ink drops. Accordingly, displacements between the heating elements c and ink-ejection nozzles h, and between the ink-pressurizing cells b and the ink-ejection nozzles h, lead to a degradation of the printing quality, and thus are a large problem.

Generally, heating processes are necessary for manufacturing the print head a. For example, after the barrier layer f is formed on the semiconductor substrate e and the nozzle-formed member g is laminated on the barrier layer f, a heat curing process for curing the barrier layer f and fixing the nozzle-formed member g is performed at a high temperature. In addition, another high-temperature curing process is performed to provide ink resistance to the barrier layer f, which is formed of dry film resist.

As described above, heating processes are necessary for manufacturing a print head. Coefficients of linear expansion of silicon, which is normally used for forming the semiconductor substrate e, and nickel, which is normally used for forming the nozzle-formed member g, differ by approximately one order of magnitude.

When two materials having extremely different coefficients of linear expansion are laminated together in a heating process, relative displacement occurs due to the difference in shrinkage rates. Such a displacement varies in accordance with the difference in the coefficients of linear expansion between the members that are laminated together, and is increased as the difference becomes larger.

With reference to FIG. 13, at position (a), the heating element c and the ink-ejection nozzle h, and the ink-pressurizing cell b and the ink-ejection nozzle h, are aligned. However, at position (b), which is apart from position (a), the ink-ejection nozzle h is displaced relative to the heating element c and to the ink-pressurizing cell b. Furthermore, at position (c), which is farther apart from position (a), the ink-ejection nozzle h is completely displaced from the ink-pressurizing cell b. Such a displacement increases along with the size of the members which are laminated together. When the heating element c and the ink-ejection nozzle h are displaced relative to each other (see FIG. 13, position (b)), the ejection direction is changed. In addition, when the displacement is increased still further (see FIG. 13, position (c)), it becomes impossible to eject ink.

In the printer market, it is required to increase the printing speed, and one approach to satisfy this requirement is to increase the number of nozzles from which ink is ejected. When the resolution of a printer is maintained and the number of nozzles is increased, the size of a print head is also increased. Thus, the influence of the displacements between the heating elements c and the ink-ejection nozzles h, and between the ink-pressurizing cells b and the ink-ejection nozzles h, which occur due to the difference in coefficients of linear expansion, is also increased. In addition, in large print heads such as line heads, etc., there is a large problem in that the displacements between the heating elements c and the ink-ejection nozzles h, and between the ink-pressurizing cells b and the ink-ejection nozzles h, become relatively large.

SUMMARY OF THE INVENTION

Accordingly, an object of the present invention is to reduce the displacements as much as possible between the ink-pressurizing cells, which are individually provided with heating elements, and the ink-ejection nozzles, which individually correspond to the ink-pressurizing cells.

In order to achieve this object, according to the present invention, a manufacturing method for a print head includes the step of laminating a correcting member, which has approximately the same coefficient of linear expansion as the substrate member, to the nozzle-formed member, so that the nozzle-formed member expands and shrinks in accordance with the coefficient of linear expansion of the substrate member when the temperature varies, wherein a nozzle interval $L_1$ of a nozzle-formed member which doesn't laminate a correcting member, which is an interval between the ink-ejection nozzles, at an operating temperature $T_0$, at which the print head is used, is determined according to the following equation:

$$L_1=L_2(1+\alpha_2\Delta T)/(1+\alpha_1\Delta T)$$

wherein:

$L_2$: nozzle interval and heater interval, which is an interval between the ink-pressurizing cells and between the heating elements, at the operating temperature after the print head is completed $\alpha_1$: coefficient of linear expansion of the nozzle-formed member $\alpha_2$: coefficient of linear expansion of the correcting member, which is approximately the same as the coefficient of linear expansion of the substrate member $T_1$: laminating temperature of the nozzle-formed member and the correcting member $\Delta T$: difference between the laminating temperature $T_1$ and the operating temperature $T_o$ ($\Delta T=T_1-T_o$).

Thus, in the print head of the present invention, the nozzle-formed member is supported by the correcting member, and the interval between the ink-ejection nozzles formed in the nozzle-formed member extends and shrinks along with a head frame. Since the coefficient of linear expansion of the correcting member is approximately the same as that of the substrate member, the displacements between the heating elements and the ink-ejection nozzles, and between the ink-pressurizing cells and the ink-ejection nozzles, can be made zero, or can be reduced to an extremely small amount.

Furthermore, since the interval between the ink-ejection nozzles $L_1$ is determined according to the following equation:

$$L_1=L_2(1+\alpha_2\Delta T)/(1+\alpha_1\Delta T),$$

the nozzle interval and the heater interval can be made approximately the same after the nozzle-formed member and the correction member are laminated together.

DESCRIPTION OF THE PREFERRED EMBODIMENT

Figure 1:
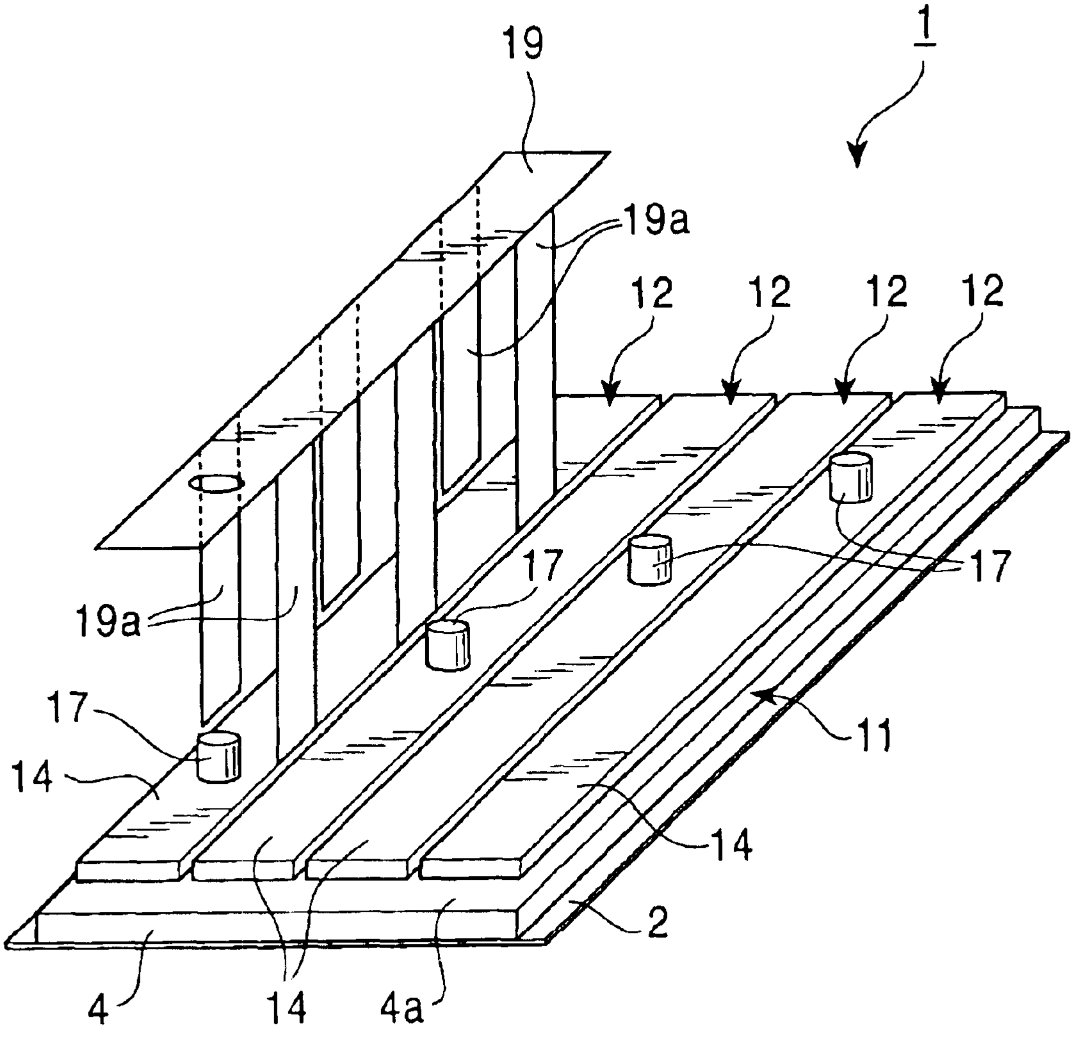
FIG. 1 is a perspective view of a print head manufactured by applying a manufacturing method according to an embodiment of the present invention.

A manufacturing method for a print head according to an embodiment of the present invention will be described below with reference to the accompanying drawings.

A print head shown in the figures is a print head for a full-color, bubble ink jet printer.

The print head 1 includes a nozzle-formed member 2, in which a plurality of ink-ejection nozzles 3 are formed. Several hundred ink-ejection nozzles 3 are formed in a single substrate member, which will be described below. The nozzle-formed member 2 is formed of, for example, nickel or a material comprising nickel, in the shape of a sheet having a thickness of 15 to 20 μm by an electroforming technique, and the ink-ejection nozzles 3 having a diameter of approximately 20 μm are formed in the nozzle-formed member 2 (see FIGS. 2 and 3).

The nozzle-formed member 2 is laminated to a head frame 4 as a correcting member. The head frame 4 includes an outside frame portion 4*a* having a rectangular shape and three bridge portions 4*b* which are integrally formed with the outside frame portion 4*a* and which link the lateral sides of the outside frame portion 4*a* at a constant interval. Accordingly, four openings 5 having a rectangular shape are formed in parallel to each other (see FIG. 2). In the case in which the print head is applied to a line printer which prints on 'A4' sized paper in a portrait orientation, the length of the openings 5 corresponds to the width of the size 'A4', that is, 21 cm.

The head frame 4 is formed of a material having the same coefficient of linear expansion as a semiconductor substrate of the substrate member, which will be described below. When, for example, a silicon substrate is used for forming the head frame 4. Alternatively, alumina ($Al_2O_3$), mullite, aluminum nitride, silicon carbide, etc., may be used from the group of ceramics, quartz ($SiO_2$), etc., may be used from the group of glass, and Invar, etc., may be used from the group of metals.

The head frame 4 may have a thickness of, for example, 5 mm, and is sufficiently rigid. When the head frame 4 is laminated on the nozzle-formed member 2 at a high temperature such as 150° C., the nozzle-formed member 2 tries to shrink by a larger amount than the head frame 4 at a temperature lower than the laminating temperature (150° C.), and thus becomes tense. Accordingly, the interval between the ink-ejection nozzles 3, that is, a nozzle interval, varies in accordance with the coefficient of linear expansion of the head frame 4. The head frame 4 is laminated on the nozzle-formed member 2 by using, for example, a heat-setting adhesive sheet.

Figure 2:
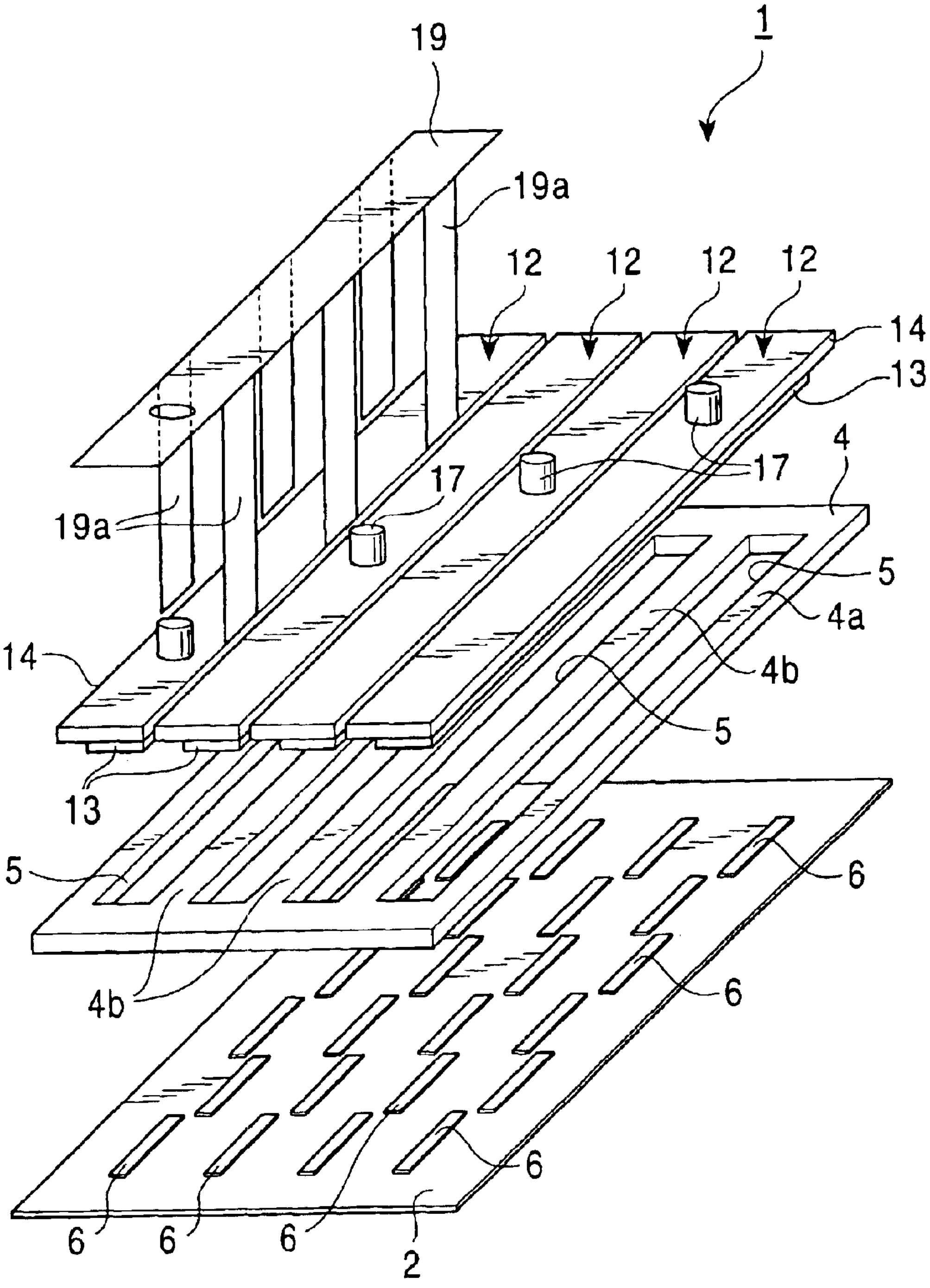
FIG. 2 is an exploded perspective view of the print head shown in FIG. 1.
Figure 3:
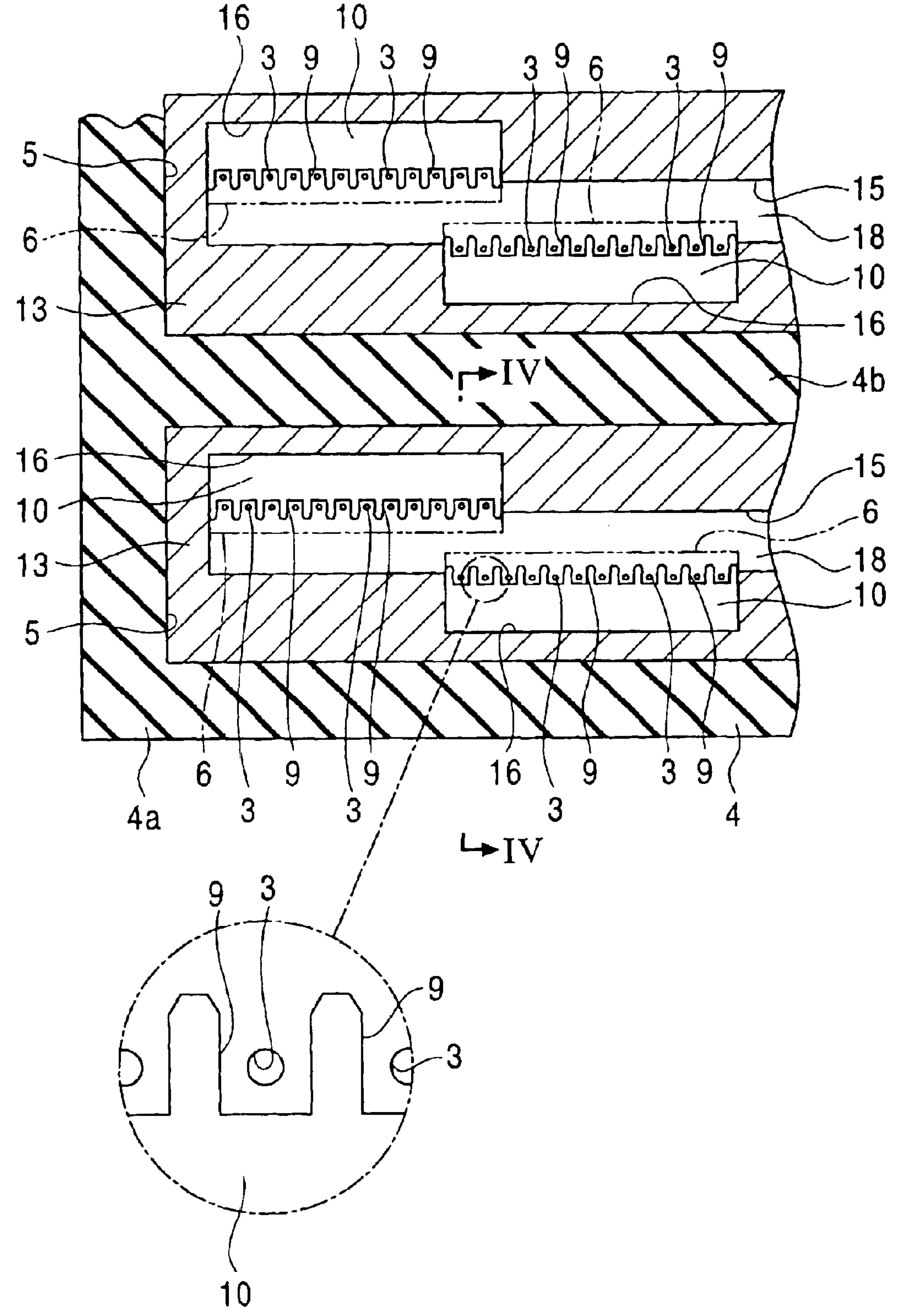
FIG. 3 is an enlarged sectional view of an important part of the print head shown in FIG. 1.
Figure 4:
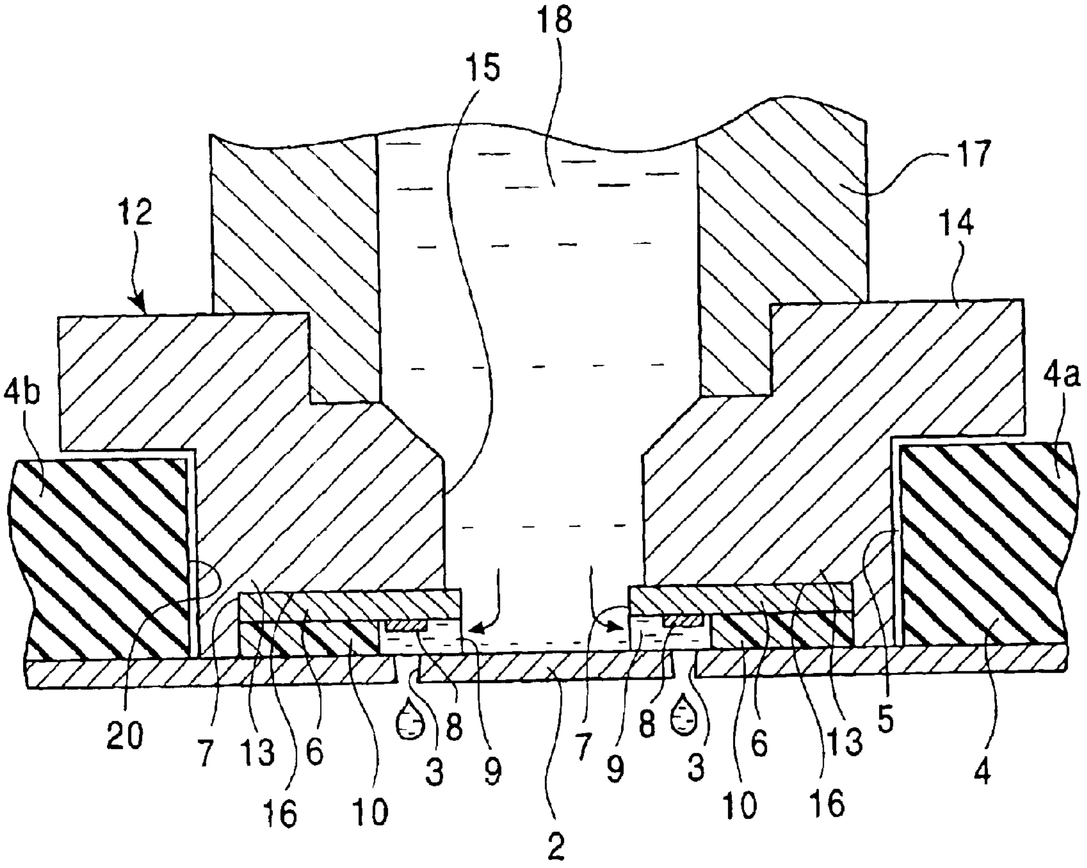
FIG. 4 is a sectional view of FIG. 3 cut along line IV—IV.

A plurality of substrate members 6 is laminated on the nozzle-formed member 2 (see FIG. 2). Each of the substrate members 6 is constructed by depositing heating elements 8 on a surface of a semiconductor substrate 7 formed of silicon, etc., and laminating a barrier layer 10 on the semiconductor substrate 7 at the same side as the side at which the heating elements 8 are deposited (see FIGS. 3 and 4). The barrier layer 10 defines side surfaces of ink-pressurizing cells 9; in other words, it serves as the side walls of the ink-pressurizing cells 9. The barrier layer 10 is formed of, for example, a dry film which is curable by light exposure, and is constructed by laminating the dry film over the entire surface of the semiconductor substrate 7, on which the heating elements 8 are formed, and removing unnecessary parts by a photolithography process. Accordingly, the substrate member 6 is completed.

In the substrate members 6, the thickness of the barrier layer 10 is approximately 12 μm, and the heating elements 8 have a square shape of which the length of each side is approximately 18 μm. In addition, the width of the ink-pressurizing cells 9 is approximately 25 μm.

As an example, a case is considered in which the print head 1 is applied to a line printer which prints on 'A4' sized paper in a portrait orientation. In such a case, for a single opening 5 formed in the head frame 4, approximately five thousand ink-ejection nozzles 3 are formed in the nozzle-formed member 2 and sixteen substrate members 6 are laminated thereon. Thus, approximately three hundred and ten ink-ejection nozzles 3 are formed in a single substrate member 6. Accordingly, it is impossible to show the accurate numbers of elements with accurate dimensions in the drawings which are limited in size. Therefore, in order to facilitate understanding, the drawings are partly exaggerated and elements are sometimes omitted.

The substrate members 6 are laminated on the nozzle-formed member 2 by heat-curing the barrier layer 10 at approximately 105° C. Accordingly, the laminating temperature is mainly determined in accordance with the characteristics of the barrier layer 10. Although the laminating temperature of the nozzle-formed member 2 and the substrate members 6 is not limited to 105° C., it is necessary that the laminating temperature of the nozzle-formed member 2 and the head frame 4 be higher than the laminating temperature of the nozzle-formed member 2 and the substrate members 6. This will be explained with reference to a graph shown in FIG. 10.

Figure 10:
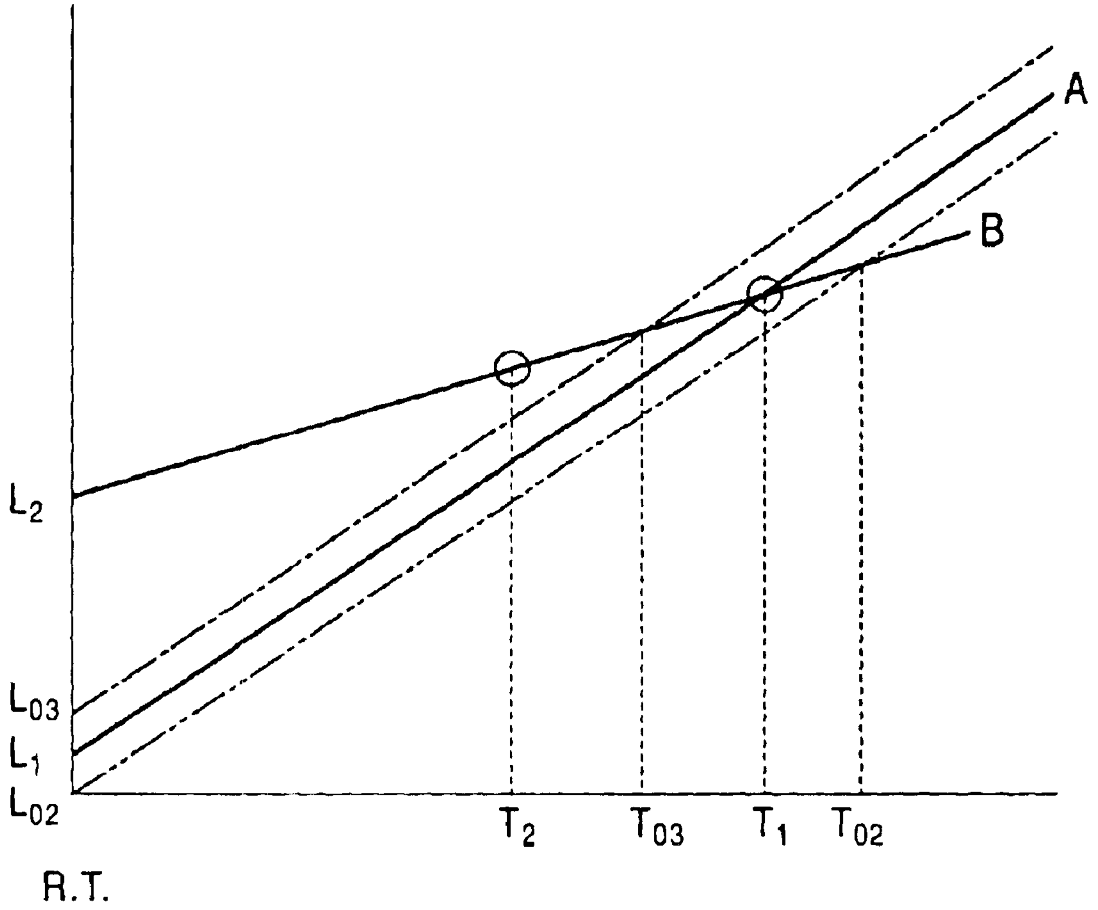
FIG. 10 is a graph which shows extension curves of the nozzle interval and the heater interval, a laminating temperature of the head frame and the nozzle-formed member, and a laminating temperature of the substrate members and the nozzle-formed member.
Figure 11:
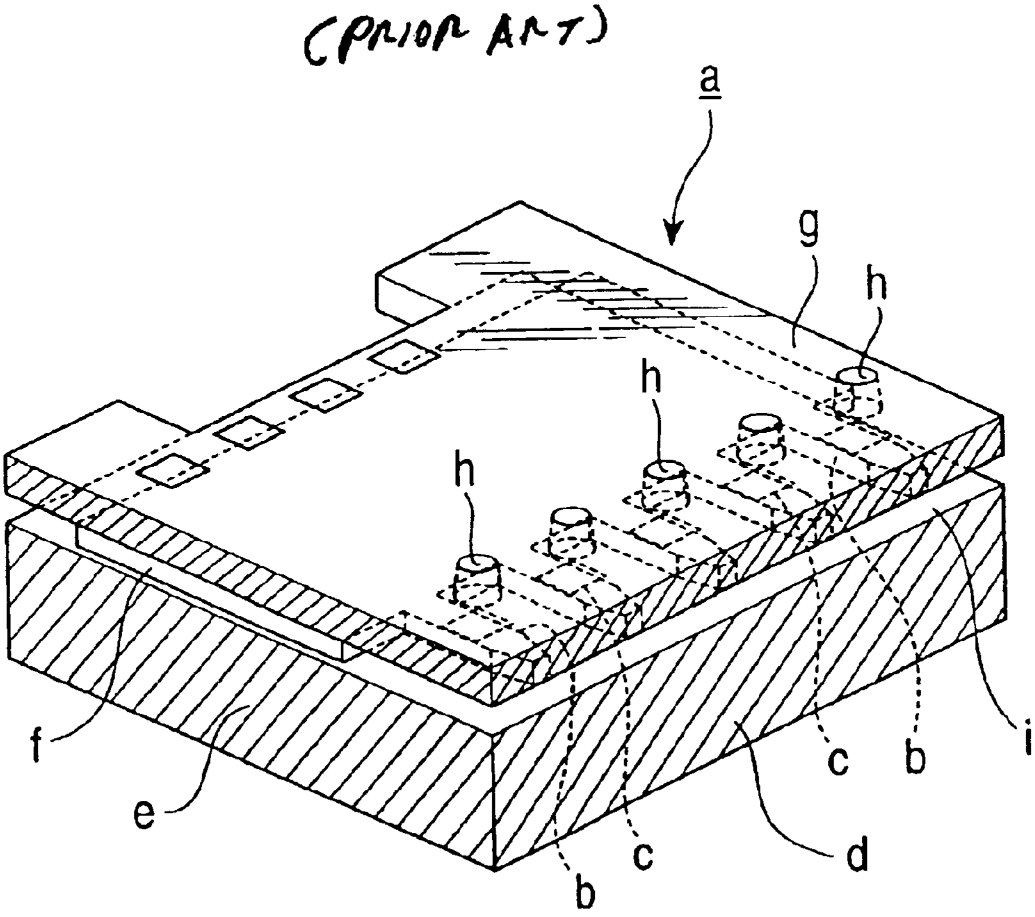
FIG. 11 (PRIOR ART)
FIG. 11 is a perspective view of an example of a conventional print head.
Figure 12:
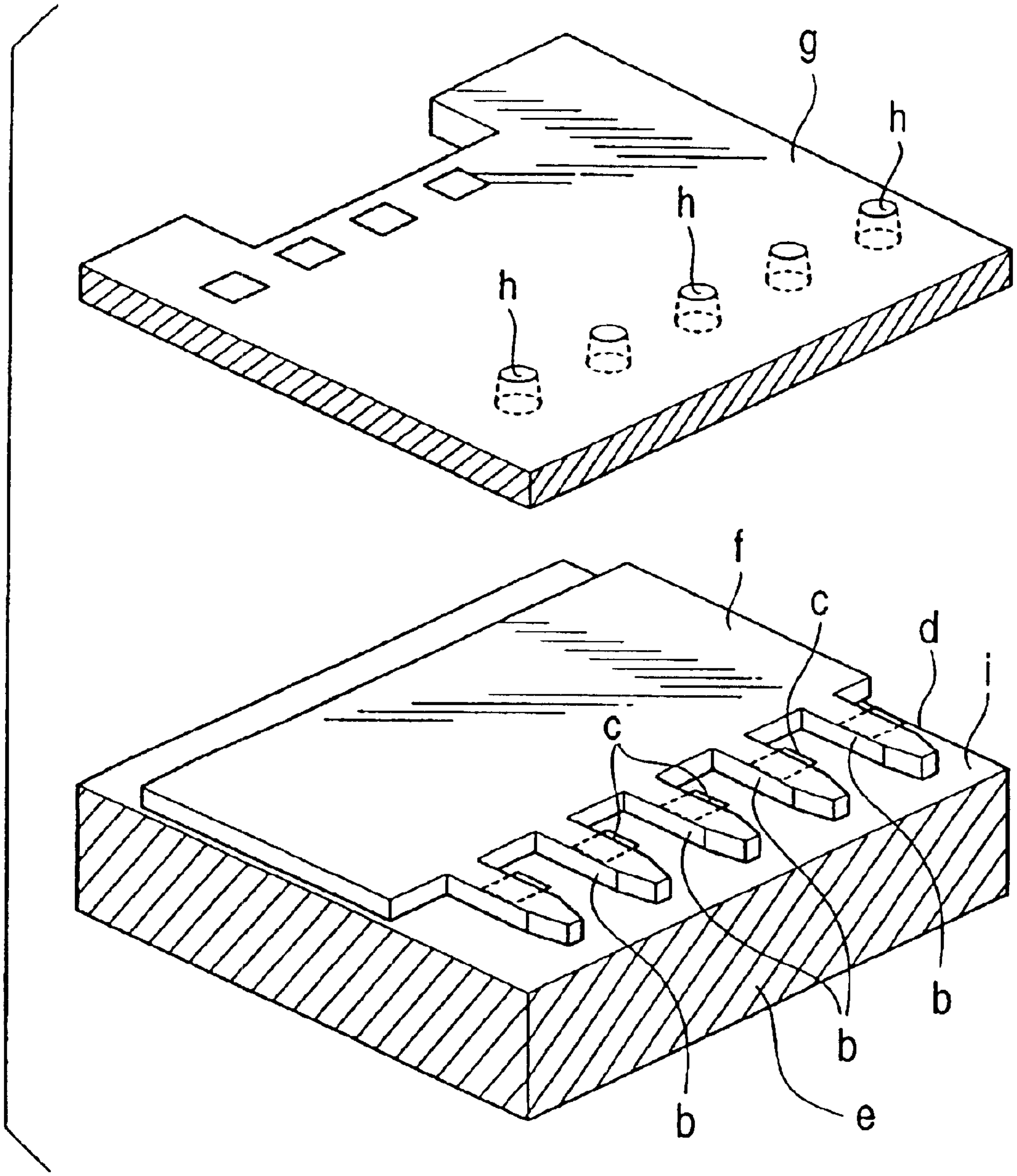
FIG. 12 (PRIOR ART)
FIG. 12 is an exploded perspective view of the conventional print head.
Figure 13:
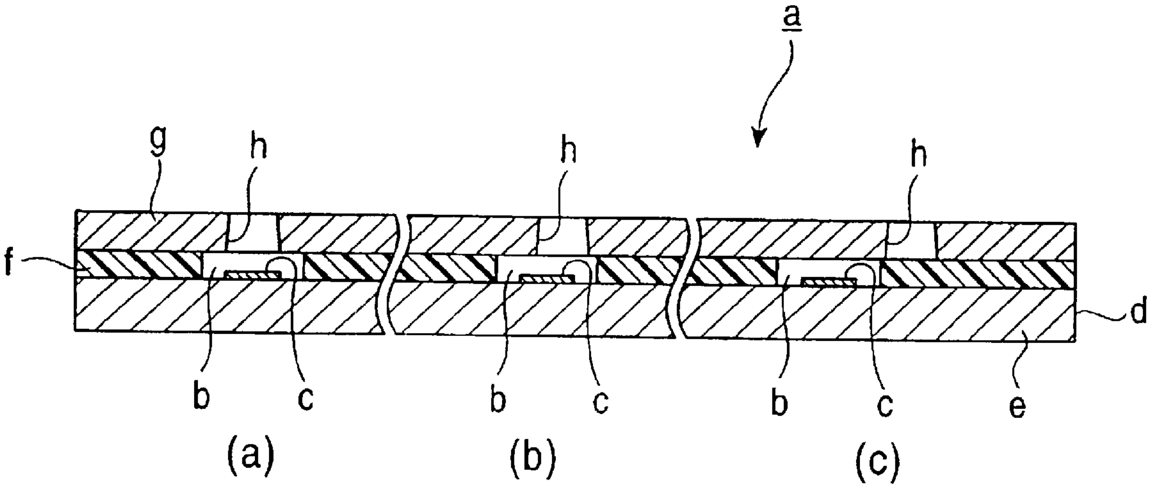
FIG. 13 (PRIOR ART)
FIG. 13 is a sectional view of the conventional print head which shows a problem of the conventional technique.

FIG. 10 is a graph which shows the relationship between the temperature and the interval between the ink-ejection nozzles 3 formed in the nozzle-formed member 2 (nozzle interval) and the relationship between the temperature and the interval between the heating elements 8 formed in the substrate members 6 (heater interval). In the graph, curve A shows the relationship between the temperature and the nozzle interval, when the nozzle interval at an operating temperature $T_o$, which is normally room temperature (R.T.), is $L_1$. In addition, curve B shows the relationship between the temperature and the heater interval, wherein the heater interval at the operating temperature $T_o$, which is also a designed value of the nozzle interval after the print head is completed, is $L_2$.

When the coefficient of linear expansion of the nozzle-formed member 2 is $\alpha_1$, the coefficient of linear expansion of the semiconductor substrate 7 is $\alpha_2$, and the difference between the laminating temperature $T_1$ and the operating temperature $T_o$ is $\Delta T$; the above-described curves A and B can be expressed as follows:

$$A{:}\ L=L_1+L_1\alpha_1 T$$

$$B{:}\ L=L_2+L_2\alpha_2 T$$

wherein, $L_2>L_1$ and $\alpha_1>\alpha_2$.

Therefore, the head frame 4 is laminated on the nozzle-formed member 2 at a temperature $T_1$, at which curve A and curve B cross each other. The intersection of curve A and curve B at the temperature $T_1$ means that the nozzle interval and the heater interval become the same when the nozzle-formed member 2 and the substrate members 6 are heated to the temperature $T_1$.

Then, the substrate members 6 are laminated on the nozzle-formed member 2 at a temperature $T_2$, which is lower than $T_1$.

When the head frame 4 is laminated on the nozzle-formed member 2 at the temperature $T_1$, the nozzle-formed member 2 tries to shrink by a larger amount than the head frame 4 at a temperature lower than the laminating temperature ($T_1$), and thus becomes tense. Accordingly, the interval between the ink-ejection nozzles 3, that is, the nozzle interval, varies in accordance with the coefficient of linear expansion of the head frame 4. Since the coefficient of linear expansion of the head frame 4 is approximately the same as that of the substrate members 6, the nozzle interval and the heater interval become approximately the same at the same temperature. Accordingly, the displacements between the heating elements 8 and the ink-ejection nozzles 3, and between the ink-pressurizing cells 9 and the ink-ejection nozzles 3 do not easily occur.

The nozzle interval of a completed print head is determined by a required precision of a printer in which the print head is to be installed. Accordingly, $L_2$ is determined in a design phase. In such a case, the required $L_1$ can be inversely calculated based on the graph shown in FIG. 10 from the coefficient of linear expansion $\alpha_1$ of the nozzle-formed member 2, the coefficient of linear expansion $\alpha_2$ of the semiconductor substrate 7 (which is also the coefficient of linear expansion of the head frame 4), the laminating temperature $T_1$ of the nozzle-formed member 2 and the head frame 4, and the temperature difference $\Delta T$ between the laminating temperature $T_1$ and the operating temperature $T_o$. Alternatively, $L_2$ may also be calculated from the following equation:

$$L_1=L_2(1+\alpha_2\Delta T)/(1+\alpha_1\Delta T)$$

Due to the differences caused in the manufacturing process, the nozzle interval at the operating temperature $T_o$ may be too small or large relative to the $L_1$. In such a case, an adjustment can be made by changing the laminating temperature of the head frame 4 and the nozzle-formed member 2.

For example, when the nozzle interval at the operating temperature $T_o$ is $L_{02}$, which is smaller than $L_1$, the head frame 4 may be laminated on the nozzle-formed member 2 at a temperature $T_{02}$, which is higher than the laminating temperature $T_1$ determined at the design phase. In addition, when the nozzle interval at the operating temperature $T_o$ is $L_{03}$, which is larger than $L_1$, the head frame 4 may be laminated on the nozzle-formed member 2 at a temperature $T_{03}$, which is lower than the laminating temperature $T_1$ determined at the design phase.

More specifically, when the obtained nozzle interval $L_1'$ is different from the designed value $L_1$, the laminating temperature $T_1'$, at which the nozzle-formed member 2 and the head frame 4 are to be laminated together, can be determined as follows:

$$T_1'=T_o+\Delta T'$$

wherein $\Delta T'=(L_2-L_1')/(\alpha_1 L_1'-\alpha_2 L_2)$

The coefficient of linear expansion of the head frame 4 is preferably lower than that of the nozzle-formed member 2. When the head frame 4 is laminated on the nozzle-formed member 2 and the temperature is reduced to the operating temperature, the nozzle-formed member 2 receives a force from the head frame 4 in either an expanding direction or a shrinking direction. The direction of the applied force is determined by the relationship between their coefficients of linear expansion. When the nozzle-formed member 2 receives the force in the shrinking direction, there is a risk that concavities and convexities (wrinkles) will be formed in the nozzle-formed member 2. Accordingly, the nozzle-formed member 2 preferably receives the force in the expanding direction, rather than in the shrinking direction. Thus, preferably, the coefficient of linear expansion of the head frame 4 is lower than that of the nozzle-formed member 2 and approximately the same as that of the substrate members 6.

In addition, the laminating temperature $T_1$ of the head frame 4 and the nozzle-formed member 2 is preferably higher than any temperatures at which following processes are performed. Accordingly, the nozzle-formed member 2 constantly receives a tension during the processes performed after the lamination of the head frame 4 and the nozzle-formed member 2, so that no wrinkles are formed. In the above-described example, the head frame 4 is laminated on the nozzle-formed member 2 at 150° C., and then the substrate members 6 are laminated on the nozzle-formed member 2 at 105° C.

Accordingly, a head unit 11 is formed by combining the head frame 4, the nozzle-formed member 2, and the substrate members 6, and ink-passage plates 12 are then attached to the head unit 11 (see FIG. 1).

One ink-passage plate 12 is provided for one color, and four ink-passage plates 12 individually corresponding to four colors are provided in total (see FIGS. 1 and 2). The ink-passage plates 12 are formed of a material which does not easily deform and which has ink resistance. Each of the ink-passage plates 12 includes a chamber portion 13 which fits into one of the openings 5 formed in the head frame 4, and a flange portion 14 which is integrally formed with the chamber portion 13 at one side thereof. The flange portion 14 is formed so as to have a size larger than the planer shape of the openings 5. The chamber portion 13 is provided with an opening 15 at the side opposite to the side at which the flange portion 14 is formed, and notches 16 for positioning the substrate members 6 are formed in the side walls of the opening 15 (see FIGS. 3 and 4). In addition, the flange portion 14 is provided with an ink-supply tube 17, which projects from the side opposite to the side at which the chamber portion 13 is formed, and which is connected to the above-described opening 15 (see FIGS. 1, 2, and 4).

Each of the ink-passage plates 12 is adhered to the head frame 4 in such a manner that the chamber portion 13 fits into the opening 5 and the flange portion 14 contacts the outside frame portion 4*a* and the bridge portions 4*b* of the head frame 4. In addition, the substrate members 6 laminated on the nozzle-formed member 2 are positioned inside the notches 16 formed in the chamber portion 13 and are adhered to the chamber portion 13 (see FIGS. 3 and 4).

By combining the ink-passage plates 12 with the head unit 11 as described above, closed spaces surrounded by the chamber portions 13 of the ink-passage plates 12 and the nozzle-formed member 2 are formed. These closed spaces are connected to the exterior environment only through the ink-supply tubes 17, and the substrate members 6 are disposed therein. In a single closed space, the substrate members 6 are arranged in two rows in such a manner that parts thereof overlap one another in a zigzag manner, and an ink passage 18 is formed between the two rows of the substrate members 6 (see FIG. 3). Accordingly, the ink-pressurizing cells 9 are connected to the ink passage 18.

Four flexible substrates 19, which electrically connect the heating elements 8 formed in the substrate members 6 to an exterior control unit, are individually provided for four colors (only one of them is shown in FIGS. 1 and 2). Each of the flexible substrates 19 is provided with connecting tabs 19*a*, which are inserted through openings 20 formed between the head frame 4 and the ink-passage plates 12 (see FIGS. 3 and 4), and extend to the substrate members 6. The connecting tabs 19*a* are electrically connected to contact points (not shown), which are individually connected to the heating elements 8 formed in the substrate members 6.

The ink-supply tubes 17 provided on the ink-passage plates 12 are individually connected to ink tanks (not shown), which individually contain inks of different colors, and the ink passages 18 and the ink-pressurizing cells 9 are filled with ink supplied from the ink tanks.

When a current pulse is applied for a short time such as 1 to 3 μs to some of the heating elements 8 selected in accordance with a command issued by the control unit of the printer, the corresponding heating elements 8 are rapidly heated. Accordingly, at each of the corresponding heating elements 8, a bubble of ink vapor (ink bubble) is generated at the surface thereof. Then, as the ink bubble expands, a certain volume of ink is pushed ahead, and the same volume of ink is ejected out from the corresponding ink-ejection nozzle 3 as an ink drop. The ink drop, which is ejected from the ink-ejection nozzle h, adheres (lands on) to a print medium such as a piece of paper, etc. Then, the ink-pressurizing cells 9 from which the ink drops are ejected are immediately refilled with ink through the ink passages 18 by the same amount as the ejected ink drops.

The manufacturing process of the above-described print head 1 will be briefly explained below with reference to FIGS. 5 to 9.

Figure 5:
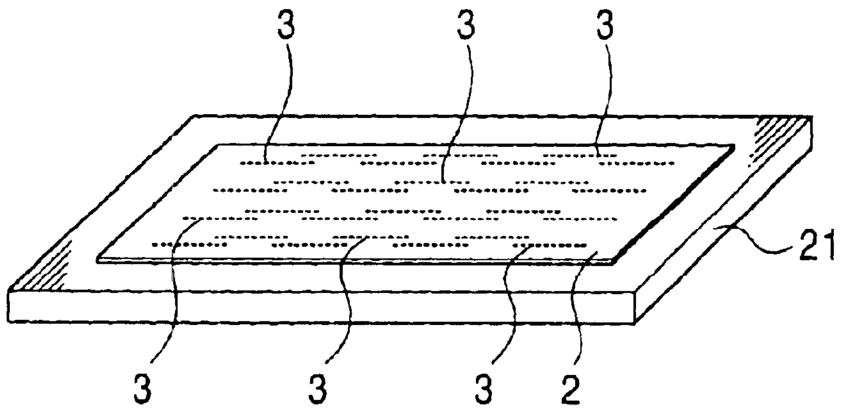
FIG. 5 is a perspective view which shows a state in which a nozzle-formed member is disposed on a supporting jig in a manufacturing process of the print head according to the embodiment.

First, the nozzle-formed member 2 is formed by an electroforming technique, and is disposed on a supporting jig 21 having a flat surface (see FIG. 5). The reason why the nozzle-formed member 2 is disposed on the supporting jig 21 is because the nozzle-formed member 2 is extremely thin and it cannot maintain its shape by itself.

Figure 6:
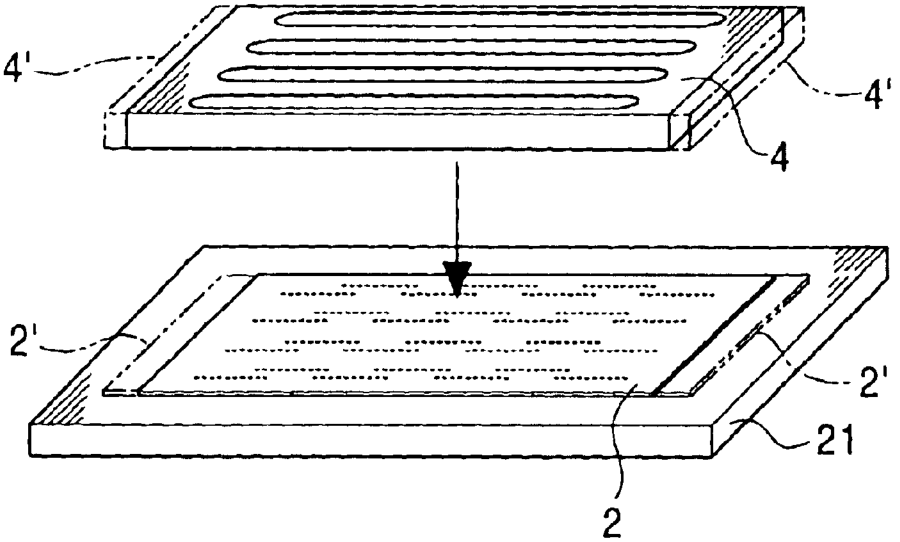
FIG. 6 shows a step of combining a head frame and the nozzle-formed member in the manufacturing process.

Next, the head frame 4 is laminated on the nozzle-formed member 2 disposed on the supporting jig 21 by heating a heat-setting adhesive sheet, for example, an epoxy adhesive sheet, at 150° C. (see FIG. 6). In FIG. 6, reference numerals 1' and 4' schematically show the shapes of the nozzle-formed member 1 and the head frame 4 which extend by being heated to 150° C.

Figure 7:
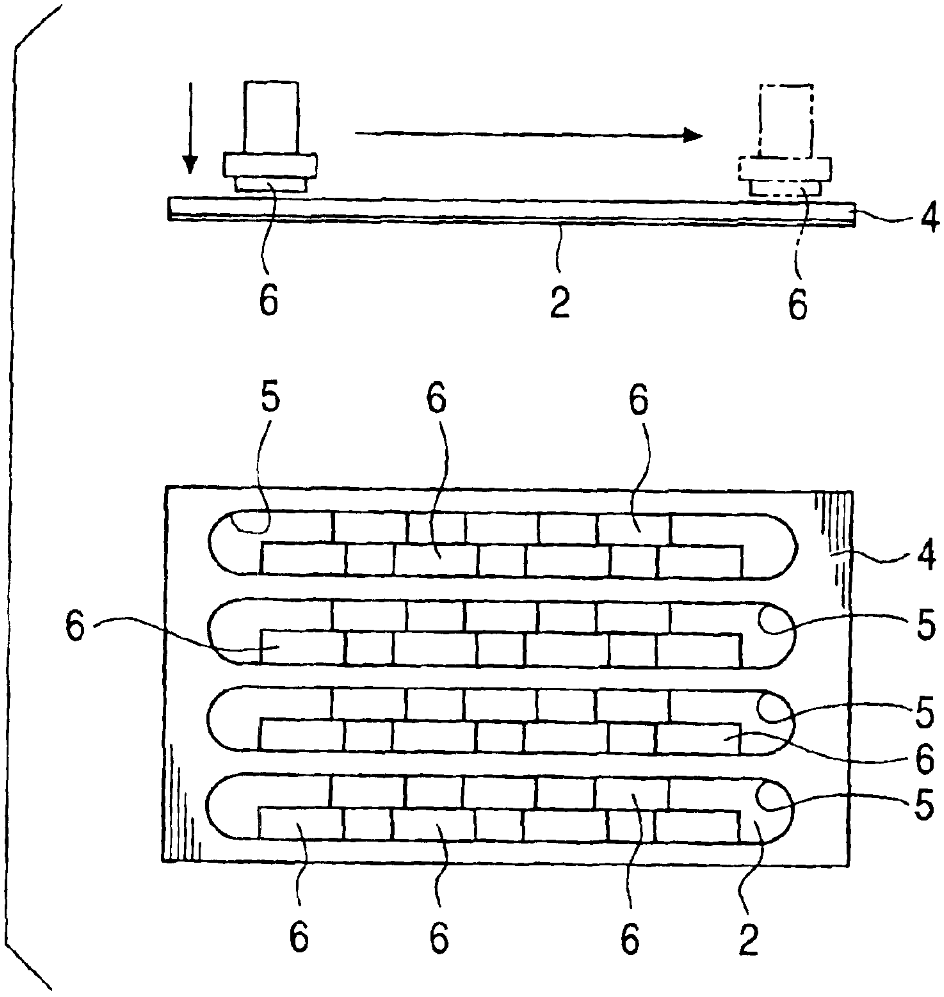
FIG. 7 shows a step of combining substrate members and the nozzle-formed member in the manufacturing process.
Figure 8:
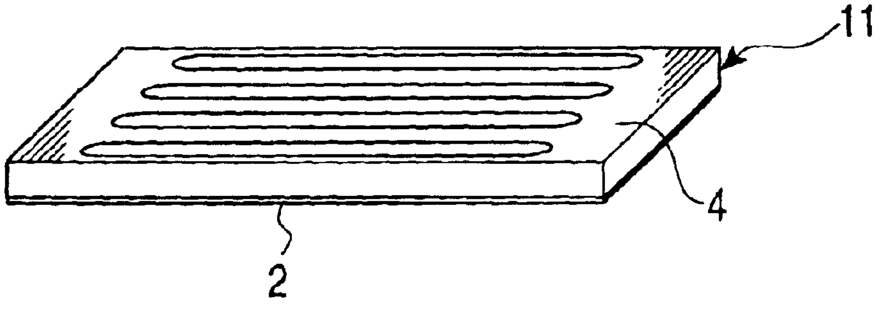
FIG. 8 is a perspective view of a head unit which is constructed by combining the head frame, the nozzle-formed member, and the substrate members.

Next, the supporting jig 21 is removed, and the substrate members 6 are laminated on the nozzle-formed member 2 at 105° C. (see FIG. 7). FIG. 7 only schematically shows the laminating step, and only seven substrate members 6 are shown for each color.

Figure 9:
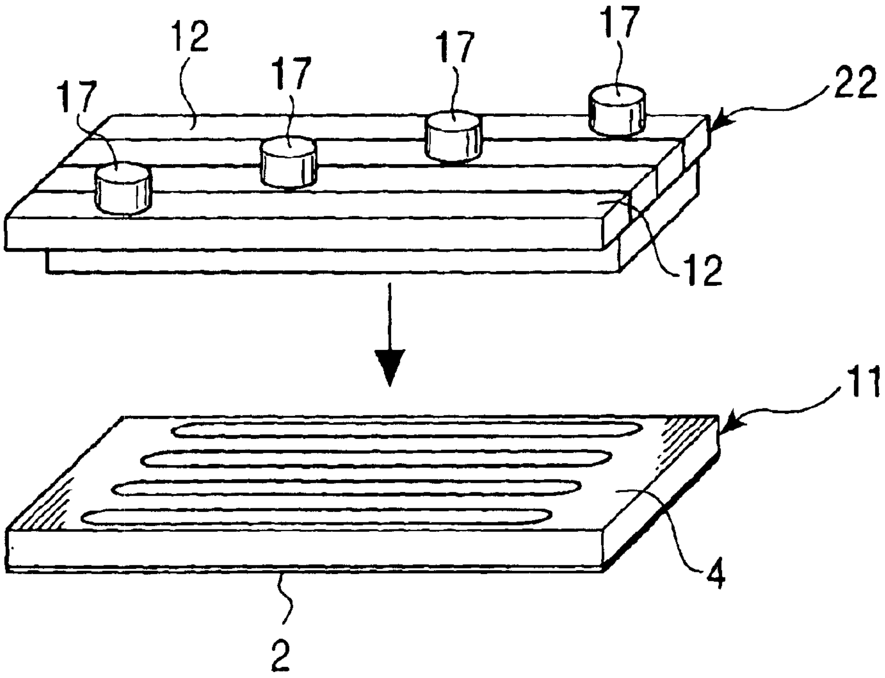
FIG. 9 shows a step of combining the head unit and an ink-passage unit.

Accordingly, the head unit 11 is completed (see FIG. 8), and an ink-passage unit 22, which is constructed by another process, is attached to the head unit 11 (see FIG. 9). The ink-passage unit 22 is constructed by combining the above-described four ink-passage plates 12 using a connecting member (not shown).

In the print head 1, the head frame 4 is first laminated on the nozzle-formed member 2. The head frame 4 has approximately the same coefficient of linear expansion as that of the semiconductor substrates 7 (for example, silicon substrates), which are the base substrates of the substrate members 6. Then, the substrate members 6 are laminated on the nozzle-formed member 2 at a temperature lower than the laminating temperature of the head frame 4 and the nozzle-formed member 2. Accordingly, the interval between the ink-ejection nozzles 3 formed in the nozzle-formed member 2 and the interval between the heating elements 8 formed in the substrate members 6 are always the same at temperatures lower than the laminating temperature of the nozzle-formed member 2 and the head frame 4. Thus, a print head having improved characteristics of ink drop ejection can be obtained. Even when the size of the substrate members 6 and the numbers of heating elements 8 and the ink-ejection nozzles 3 provided for a single substrate member 6 are increased, displacements between the exothermic elements 8 and the ink-discharge nozzles 3 do not easily occur. Accordingly, the size of the print head 1 can be easily increased, and thus the print head 1 is especially suitable for long print heads such as print heads for line printers, etc.

In addition, by laminating the head frame 4 on the nozzle-formed member 2, the nozzle-formed member 2 obtains high rigidity. Thus, as described above, it is possible to form a print head for a line printer in which four print heads for four colors are combined.

Although the present invention was applied to a print head for a full-color, bubble ink jet printer in the above-described embodiment, the present invention may also be applied to print heads for monocolor printers. In addition, even in the case in which the present invention is applied to a print head for a full-color printer, the present invention is not limited to the above-described structure in which the four print heads for four colors are combined, and an individual print head may be prepared for each color.

Furthermore, the shapes and structures of the members of the above-described embodiment are described merely for illustrating an example of a print head to which the present invention is applied, and are not intended to limit the scope of the present invention.

What is claimed is:

1. A manufacturing method for a print head, in which a substrate member, which forms side surfaces and one end surface of ink-pressurizing cells and which is provided with heating elements, is laminated at a high temperature to a nozzle-formed member, which forms the other end surface of the ink-pressurizing cells and in which ink-ejection nozzles, which individually correspond to the ink-pressurizing cells, are formed, the manufacturing method for the print head comprising:

laminating a correcting member, which has approximately the same coefficient of linear expansion as the substrate member, to the nozzle-formed member, so that the nozzle-formed member expands and shrinks in accordance with the coefficient of linear expansion of the substrate member when the temperature varies, wherein a nozzle-formed member having an interval $L_1$ between the ink-ejection nozzles, at an operating temperature $T_o$ at which the print head is used, is determined according to the following equation:

$$L_1=L_2(1+\alpha_2\Delta T)/(1+\alpha_1\Delta T),$$

wherein $L_2$ represents a heater interval at the operating temperature $T_o$ and also represents the nozzle interval after the print head is completed, $\alpha_1$ represents the coefficient of linear expansion of the nozzle-formed member, $\alpha_2$ represents the coefficient of linear expansion of the correcting member, $T_1$ represents the laminating temperature of the nozzle-formed member and the correcting member, and $\Delta T$ represents the difference between the laminating temperature $T_1$ and the operating temperature $T_o$; and wherein the laminating of the correcting member is performed at a higher temperature than the laminating of the substrate member.

2. A manufacturing method for a print head according to claim 1, wherein, when the nozzle interval between the ink-ejection nozzles formed in the nozzle-formed member $L_1'$ differs from the designed value $L_1$, the laminating temperature $T_1'$, at which the nozzle-formed member and the correcting member are to be laminated together, is determined according to the following equation:

$$T_1'=T_o+\Delta T'$$

wherein:

$$\Delta T=(L_2-L_1')/(\alpha_1 L_1'-\alpha_2 L_2).$$

3. A manufacturing method for a print head comprising:

laminating a correcting member to a nozzle-formed member, wherein the nozzle-formed member forms ink-ejection nozzles; and laminating a substrate member to the nozzle-formed member, the substrate member including a heating element, wherein the correcting member has approximately the same coefficient of linear expansion as the substrate member, and the laminating of the correcting member is performed at a higher temperature than the laminating of the substrate member.

4. The method of claim 3, wherein substrate member includes a substrate and a barrier layer, and wherein the barrier layer and the heating element are located on the same side of the substrate.

5. The method of claim 4, wherein the substrate and the barrier layer forms side surfaces and one end surface of an ink-pressurizing cell.

6. The method of claim 5, wherein the heating element is located in the ink-pressurizing cell.

7. The method of claim 5, wherein a nozzle interval $L_1$ of a nozzle-formed member which doesn't laminate a correcting member, which is an interval between the ink-ejection nozzles, at an operating temperature $T_o$, at which the print head is used, is determined according to the following equation:

$$L_1=L_2(1+\alpha_2\Delta T)/(1+\alpha_1\Delta T),\text{ wherein}$$

$L_2$ is the nozzle interval and heater interval, which is an interval between the ink-pressurizing cells and between the heating elements, at the operating temperature after the print head is completed;

$\alpha_1$ is the coefficient of linear expansion of the nozzle-formed member;

$\alpha_2$ is the coefficient of linear expansion of the correcting member, which is approximately the same as the coefficient of linear expansion of the substrate member;

$T_1$ is the laminating temperature of the nozzle-formed member and the correcting member; and $\Delta T$ is the difference between the laminating temperature $T_1$ and the operating temperature $T_o$.

8. The method of claim 5, wherein, when the nozzle interval between the ink-ejection nozzles formed in the nozzle-formed member $L_1'$ differs from the designed value $L_1$, the laminating temperature $T_1'$, at which the nozzle-formed member and the correcting member are to be laminated together, is determined according to the following equation:

$$T_1'=T_o+\Delta T,\text{ wherein }\Delta T=(L_2-L_1')/(\alpha_1 L_1'-\alpha_2 L_2).$$

9. The method of claim 3, wherein the laminating of the correcting member is performed at a higher temperature than the laminating of the substrate member.

10. The method of claim 3, wherein the laminating of the correcting member is performed before the laminating of the substrate member.

11. A print head manufactured by the method of claim 3.

12. A print head comprising:

a nozzle-formed member forming an ink-ejection nozzle;

a substrate member formed on a surface of the nozzle-formed member, the substrate member forming an ink-pressuring cell in fluid communication with the ink-ejection nozzle;

a heating element located in the ink-pressurizing cell; and a correcting member formed on the same or an opposing surface of the nozzle-formed member as the substrate member.

13. The print head of claim 12, wherein the correcting member and the substrate member are both located on the same surface of the nozzle-formed member.

14. The print head of claim 12, wherein substrate member includes a substrate and a barrier layer, and wherein the barrier layer and the heating element are located on the same side of the substrate.

15. The print head of claim 14, wherein the substrate and the barrier layer form side surfaces and one end surface of the ink-pressurizing cell.

16. The print head of claim 14, wherein the barrier layer is laminated to the nozzle-formed member.

17. The print head of claim 12, wherein the correcting member has approximately the same coefficient of linear expansion as the substrate member.

18. The print head of claim 12, further comprising a barrier layer between the substrate member and the nozzle formed member.

19. The print head of claim 12, wherein the substrate member is formed on the same surface of the nozzle-formed member as, and in between, two portions of the correcting member.

* * * * *